United States Patent
Baran et al.

(10) Patent No.: US 10,238,004 B2
(45) Date of Patent: Mar. 19, 2019

(54) CONTROLLER WITH ENHANCED THERMAL PROPERTIES

(71) Applicant: Rockwell Automation Technologies, Inc., Mayfield Heights, OH (US)

(72) Inventors: Michael S. Baran, Milwaukee, WI (US); Nathan J. Molnar, Shaker Heights, OH (US); Mark S. Williams, Waukesha, WI (US); Michael A. Sutton, Hales Corners, WI (US); John C. Laur, Cudahy, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 15/720,537

(22) Filed: Sep. 29, 2017

(65) Prior Publication Data

US 2018/0132380 A1    May 10, 2018

Related U.S. Application Data

(60) Provisional application No. 62/418,595, filed on Nov. 7, 2016.

(51) Int. Cl.
*H05K 1/02* (2006.01)
*H05K 7/12* (2006.01)
(Continued)

(52) U.S. Cl.
CPC ..... *H05K 7/20163* (2013.01); *F04D 25/0613* (2013.01); *F04D 25/166* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,642,260 A * 6/1997 Sigl .................. B23K 9/32
174/16.1
6,459,582 B1  10/2002 Ali et al.
(Continued)

FOREIGN PATENT DOCUMENTS

JP    2008 306138    12/2008

OTHER PUBLICATIONS

Extended European Search Report dated Aug. 14, 2018 for Application No. EP 17 20 0387.3.

*Primary Examiner* — Anthony M Haughton
*Assistant Examiner* — Razmeen Gafur
(74) *Attorney, Agent, or Firm* — Fay Sharpe LLP (57) ABSTRACT

An electronics module includes a housing with: (i) a forced convection chamber including an internal forced convection space; and, (ii) a passive chamber including an internal passive space that is separated from the forced convection space. At least one fan is connected to the housing and adapted to induce forced convection airflow in the forced convection space. A heat sink is connected to the housing and includes: (i) a heat input portion exposed to the passive space; and, (ii) a heat output portion exposed to the forced convection space. A circuit board assembly is located in the passive space and includes at least one electronic component that is thermally engaged with the heat input portion of the heat sink. A clamping plate is secured to the heat sink and captures the circuit board to the heat sink. The circuit board is isolated from the fan-induced forced convection airflow.

8 Claims, 8 Drawing Sheets

(51) Int. Cl.
  *H05K 7/14* (2006.01)
  *H05K 7/20* (2006.01)
  *F04D 25/06* (2006.01)
  *F04D 25/16* (2006.01)
  *F04D 27/00* (2006.01)
  *F04D 29/60* (2006.01)

(52) U.S. Cl.
  CPC ......... *F04D 27/008* (2013.01); *F04D 29/601* (2013.01); *H05K 1/0203* (2013.01); *H05K 7/12* (2013.01); *H05K 7/1465* (2013.01); *H05K 7/20145* (2013.01); *H05K 7/20172* (2013.01); *H05K 7/20209* (2013.01); *H05K 7/20409* (2013.01)

(58) Field of Classification Search
  CPC ................ H05K 7/20409–7/20418; H05K 7/20009–7/202; H01L 23/367–23/3677; H01L 23/473; H01L 23/46–23/467
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 6,477,053 | B1* | 11/2002 | Zeidan | H05K 7/20127 165/80.3 |
| 6,504,721 | B1* | 1/2003 | Watwe | G06F 1/203 165/104.21 |
| 6,906,483 | B2* | 6/2005 | Tominaga | B62D 5/0406 318/280 |
| 8,634,193 | B2 | 1/2014 | Zhou et al. | |
| 2004/0253130 | A1* | 12/2004 | Sauciuc | F04D 33/00 417/436 |
| 2007/0211436 | A1* | 9/2007 | Robinson | H01L 23/552 361/719 |
| 2007/0227701 | A1* | 10/2007 | Bhatti | F28D 15/0275 165/104.21 |
| 2008/0030951 | A1* | 2/2008 | Hall | H05K 7/20918 361/696 |
| 2008/0115914 | A1* | 5/2008 | Yang | H01L 23/427 165/104.33 |
| 2008/0264603 | A1* | 10/2008 | Colbert | H01L 23/4006 165/80.2 |
| 2010/0043451 | A1* | 2/2010 | Alahyari | A23L 3/16 62/3.3 |
| 2010/0218919 | A1* | 9/2010 | Shibata | F24F 12/006 165/104.34 |
| 2010/0232109 | A1 | 9/2010 | Liu | |
| 2011/0235280 | A1* | 9/2011 | Hsieh | G06F 1/20 361/720 |
| 2012/0160454 | A1* | 6/2012 | Zhang | F28D 15/0266 165/104.26 |
| 2013/0141867 | A1* | 6/2013 | Zhou | H05K 7/20127 361/691 |
| 2014/0190184 | A1* | 7/2014 | Mahajan | F25B 21/02 62/3.2 |
| 2014/0293542 | A1* | 10/2014 | Vetrovec | H01L 23/473 361/699 |
| 2015/0354902 | A1* | 12/2015 | McDonald | F28D 15/0275 165/45 |
| 2015/0355057 | A1* | 12/2015 | Saari | G01N 3/18 73/863.02 |
| 2016/0282376 | A1* | 9/2016 | Keller | G01N 1/312 |
| 2016/0325284 | A1* | 11/2016 | Camillo | B01L 3/5025 |
| 2017/0023306 | A1* | 1/2017 | Stavi | F28D 15/0275 |
| 2017/0075394 | A1* | 3/2017 | Lin | G06F 1/20 |
| 2017/0147045 | A1* | 5/2017 | Takeuchi | G06F 1/20 |
| 2018/0080689 | A1* | 3/2018 | Ilercil | F25B 21/02 |

* cited by examiner

CONTROLLER WITH ENHANCED THERMAL PROPERTIES

CROSS-REFERENCE TO RELATED APPLICATION

This application claims priority from and benefit of the filing date of U.S. provisional patent application Ser. No. 62/418,595 filed Nov. 7, 2016, and the entire disclosure of said provisional application is hereby expressly incorporated by reference into the present specification.

BACKGROUND INFORMATION

Certain industrial automation controllers utilize a high-speed microprocessor (processor) and other components that generate heat beyond that which can be dissipated sufficiently using natural convection airflow. In such cases, the controller must utilize a fan to flow forced air through the controller housing in which the processor is located to cool the processor.

Use of a fan to cool an industrial automation controller has drawbacks including fan reliability and the tendency of the fan to draw contaminants into the controller housing including dust, dirt, moisture, corrosive particles, and other undesired particulates and contaminants that can damage the controller and degrade its performance over time and lead to a shorter operational life.

It is not unusual for industrial electronic devices to be used in environments with abnormally high levels of atmospheric contaminants. Printed circuit boards and their electronic components subjected to such atmospheres are often subject to shorter operational life because the contaminants may cause corrosion, short circuits, open circuits, unintended changes in impedances, etc. A device which requires forced convection for adequate cooling will expose the printed circuit board assembly (PCBA) to orders of magnitude greater airflow and atmospheric contaminants than a device which requires only natural convection for equivalent cooling.

The method typically used to solve this problem is conformal coating which adds a layer of protective material over sensitive areas of the printed circuit board and selected components. Challenges of employing conformal coating include: high cost due to material usage/process time/inspection/rework, difficulty in achieving complete coverage, difficulty in not applying material to areas like contacts or mating connectors, and difficulty in repairing PCBAs after coating. Designing for a more robust conformal coating process outcome typically results in inefficient use of printed circuit board (PCB) real estate (i.e. a larger product than desired or otherwise possible).

In certain known arrangements, a heat sink is attached to the processor or other heat-generating components on the PCBA to aid in cooling the device to which the heat sink is attached. Maintaining expected levels of reliability in a compact size requires an effective cooling interface between the processor and a heat sink without adding undue stress to processor solder joints or other components on a densely populated PCBA in an industrial environment wherein the PCBA is subjected to vibration, mechanical shock, and other harsh conditions. Known systems have been suboptimal in terms of providing an effective interface between the heat sink and processor or other component on the PCBA, without over stressing the solder joints and other portions of the PCBA.

SUMMARY

In accordance with a first aspect of the present development, an electronics module includes a housing with: (i) a forced convection chamber including an internal forced convection space; and, (ii) a passive chamber including an internal passive space that is separated from the forced convection space of the forced convection chamber. At least one fan is connected to the housing and adapted to induce forced convection airflow in the forced convection space. A heat sink is connected to the housing and includes: (i) a heat input portion exposed to the passive space; and, (ii) a heat output portion exposed to the forced convection space. A circuit board assembly is located in the passive space and includes at least one electronic component that is thermally engaged with the heat input portion of the heat sink.

In accordance with another aspect of the present development, a heat sink subassembly includes a heat sink with base and a heat output region connected to the base. A clamping plate is secured to the heat sink base. A circuit board is captured adjacent the heat sink base by the clamping plate.

DETAILED DESCRIPTION

Figure 1:
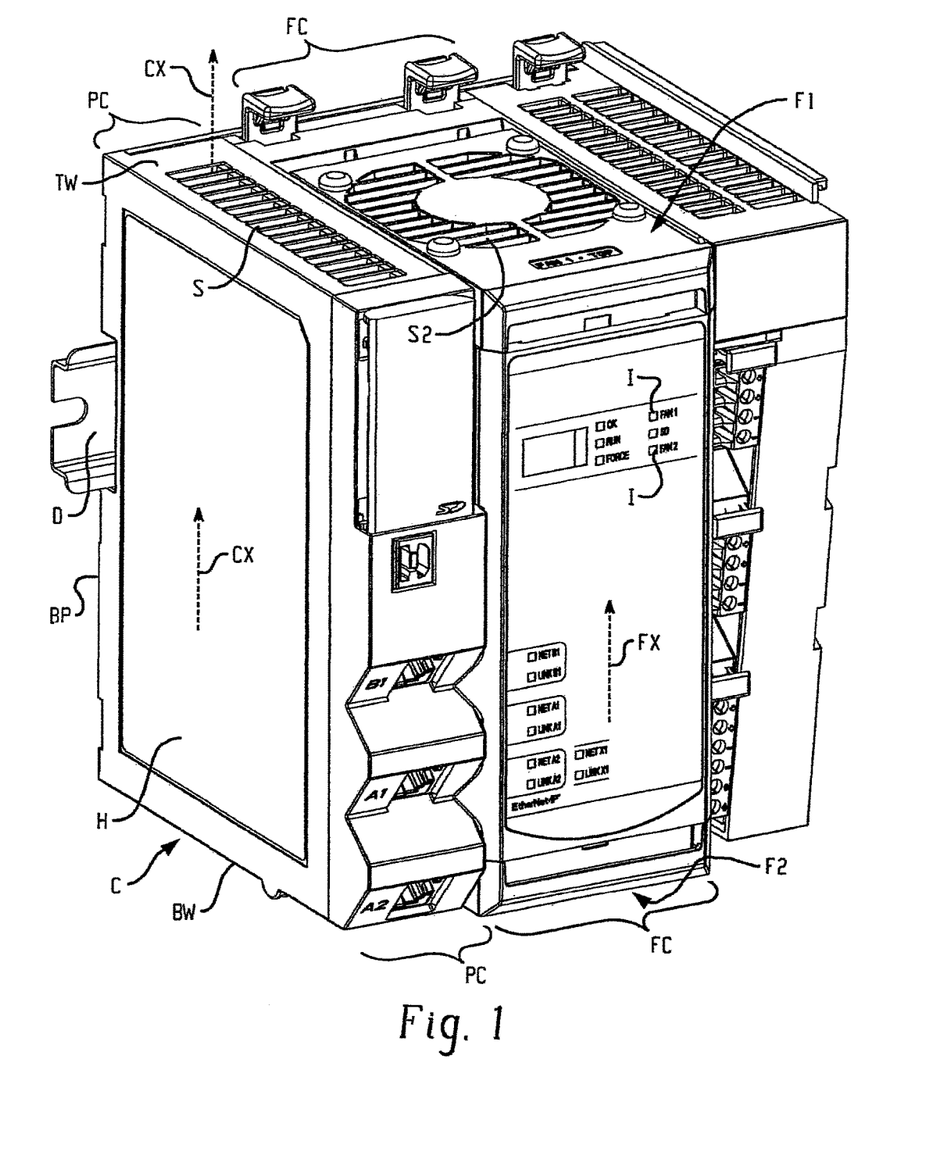
FIG. 1 shows an industrial automation controller according to the present development mounted to a DIN rail.
Figure 2:
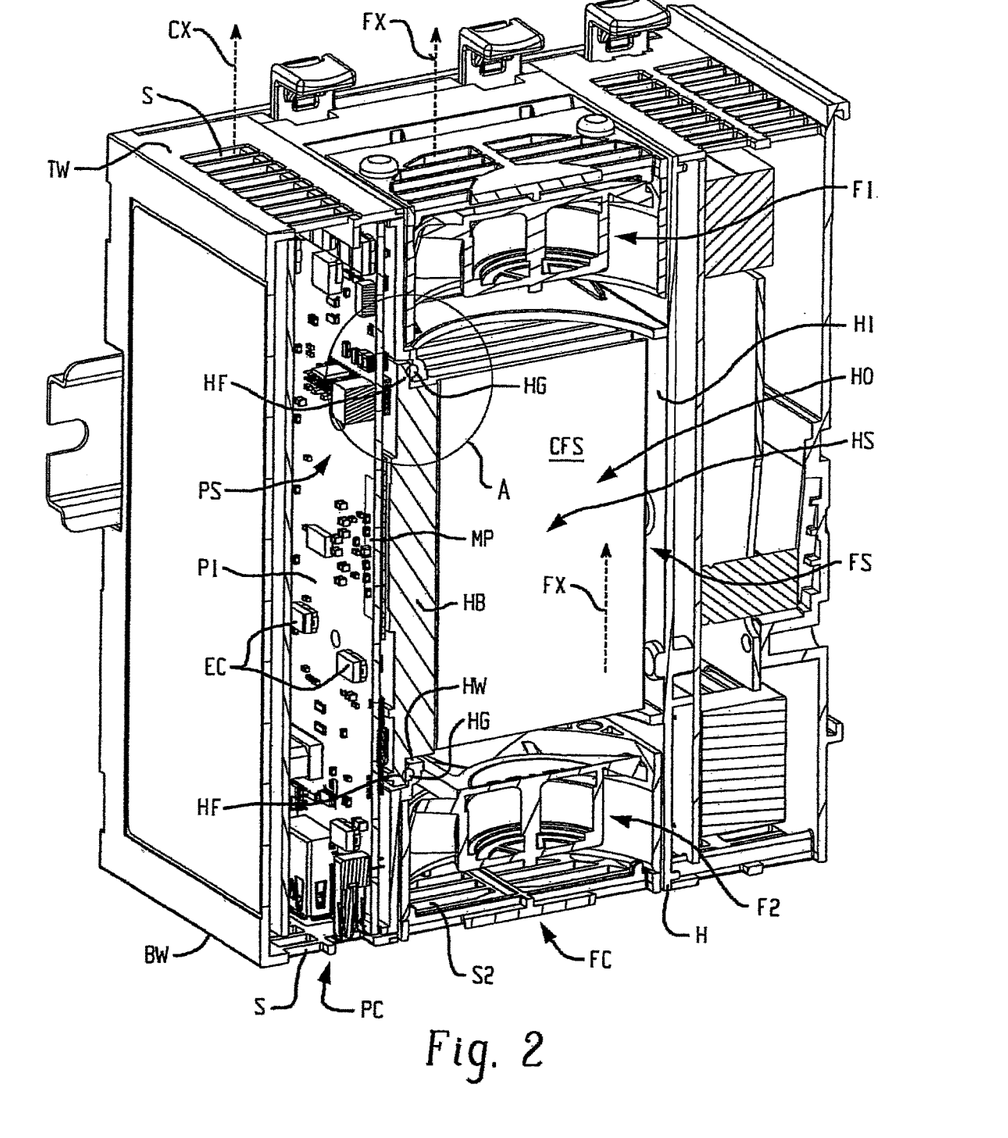
FIG. 2 shows a section view of the controller of FIG. 1.
Figure 2A:
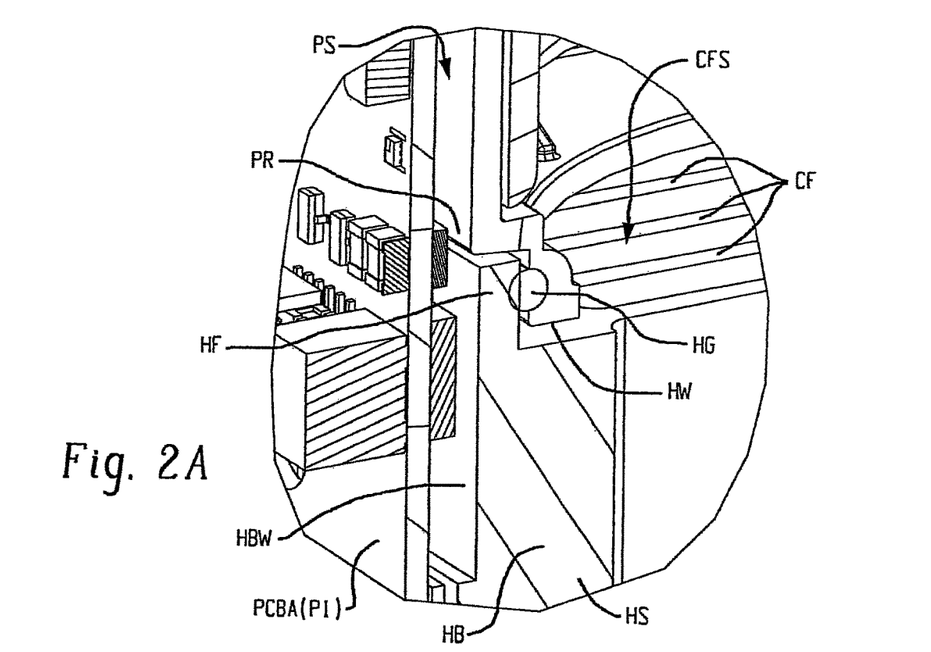
FIG. 2A provides a greatly enlarged detail view of portion A of FIG. 2.

FIG. 1 shows an electronics module according to an embodiment of the present development, which is shown herein as an industrial automation controller C mounted to an associated DIN rail D. FIG. 2 shows a cross-section view of the controller C, and FIG. 2A provides a greatly enlarged view of detail portion A of FIG. 2.

The controller C includes an enclosure or housing H that internally is divided into at least one forced convection chamber FC and at least one passive chamber PC which is located adjacent the forced convection chamber FC in the present embodiment. As described in further detail below, the passive chamber PC can comprise a natural convection chamber that is open or unsealed to allow natural convection airflow CX there through (as shown herein), or the passive chamber PC is closed or sealed to prevent or at least minimize convection airflow there through to prevent or inhibit ingress of contaminants. As can be seen in FIG. 2, the passive chamber PC comprises an open, internal passive space PS defined by the housing H, and the forced convection chamber FC comprises an open, internal forced convection space FS defined by walls of the housing H. More particularly the internal forced convection space FS is defined by a forced convection housing portion H1 of the housing H, which is shown separately in FIG. 4.

As noted above, the passive chamber PC in the illustrated embodiment comprises a natural convection chamber that provides for passive, convection airflow through its internal passive space PS. One or more slots S are defined in top and bottom outer walls TW,BW of the housing H or elsewhere in the housing and provide fluid communication between the ambient atmosphere surrounding the housing H and the internal passive space PS of the passive chamber PC to allow air to flow through the natural or passive convection chamber PC due to unassisted convection as indicated by the arrows CX. Alternatively, the slots S are omitted or blocked so that the passive chamber PC is closed or sealed to prevent or at least minimize convection airflow through the internal space PS thereof, and also to prevent or at least inhibit ingress of airborne contaminants such as moisture, dust, oil, vapors, and the like.

The forced convection chamber FC defined by the controller housing H includes at least one active fan F1,F2 that induces forced airflow (as indicated by the arrows FX) through the internal forced convection space FS thereof. One or more slots S2 are defined in top and bottom outer walls TW,BW of the housing H or elsewhere in the housing and provide fluid communication between the ambient atmosphere surrounding the housing H and the internal forced convection space FS of the forced convection chamber FC to allow the forced airflow FX to enter and exit the forced convection space FS. In the illustrated embodiment, the controller comprises a first (upper/exhaust) fan F1 and a second (lower/intake) fan F2 that induces forced airflow FX through the internal space FS of the forced convection chamber FC. The fans F1,F2 are preferably operated to move air in the same single direction, with the first (upper) fan F1 operated to exhaust air from the internal space FS and the second (lower) fan operated to intake ambient air into the internal space FS to provide the forced convection airflow FX.

A main or primary printed circuit board assembly (PCBA) P1 including electronic components EC comprising a CPU processor MP (see FIGS. 2 & 6) and related electronic components is operatively located in the internal space PS of the passive chamber PC. The processor MP and other electronic components of the printed circuit board assembly P1 generate heat that sometimes cannot be dissipated sufficiently by the natural convection airflow CX, but it is undesirable as noted above to subject the printed circuit board assembly P1 to direct fan-forced airflow for cooling.

Figure 3:
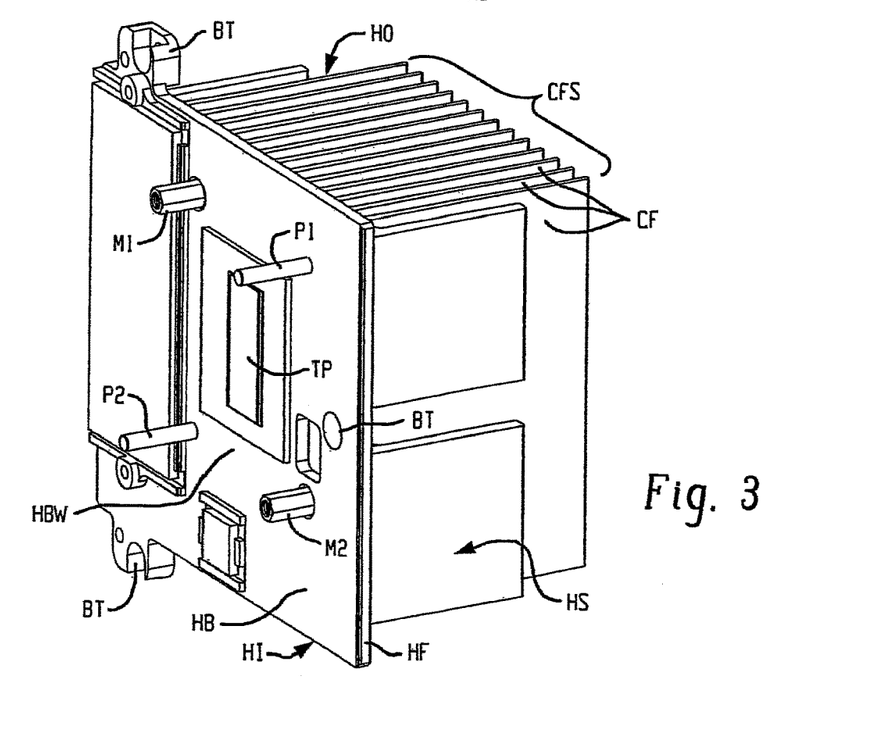
FIG. 3 is an isometric view that shown an example of a heat sink provided as part of the controller of FIG. 1.

Instead, according to the present development, the controller C or other electronics module structured according to the present development comprises a heat sink HS, which is also shown separately in FIG. 3. When operatively installed to the housing H, the heat sink HS is partially located in the passive chamber PC or at least exposed to the passive space PS of the passive chamber PC and partially located in the forced convection chamber FC or at least exposed to the forced convection space FS of the forced convection chamber FC. In particular, a base HB or heat input region or heat input portion HI of the heat sink HS is located in or at least exposed to the passive space PS, and the heat sink base HB is operatively thermally engaged with the processor MP or at least one other electronic component EC of the printed circuit board assembly P1 such that the processor MP or other electronic components EC of the printed circuit board P1 conduct heat directly into the heat sink base HB through an uninterrupted, continuous thermal pathway as described below. In the illustrated embodiment, the heat sink base HB comprises an outer wall HBW that is exposed to the internal passive space PS of the passive chamber PC and that is located adjacent and thermally engaged with at least one electronic component EC (preferably the processor MP) of the printed circuit board assembly P1.

The heat sink HS further comprises a heat output portion HO such as a cooling fin structure CFS including a plurality of spaced apart cooling fins CF or other large surface structures connected to and projecting outwardly away from the base HB. The heat sink HS is provided by a one-piece aluminum structure or other metallic or other thermally conductive material constructed in one-piece or fabricated from multiple pieces.

As shown in FIG. 2, when the heat sink HS is operatively installed in the housing H of the controller C, the cooling fin structure CFS or other heat output portion HO is located in and/or exposed to the internal forced convection space FS of the forced convection chamber FC such that the cooling fin structure CFS or other heat output portion HO is exposed to the fan-induced forced airflow FX moving through the internal space FS of the forced convection chamber FC.

Figure 4:
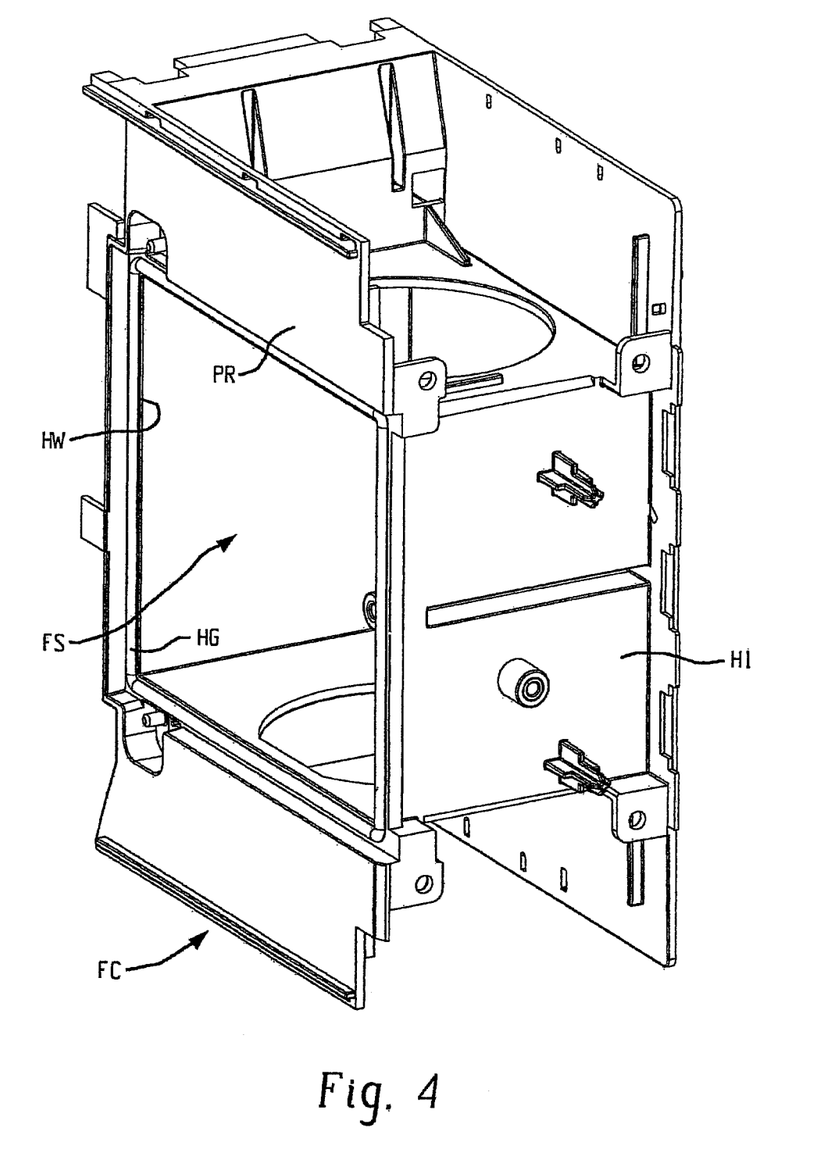
FIG. 4 shows a forced convection portion of a controller housing for the controller of FIG. 1.

FIG. 4 shows the forced convection portion H1 of the housing H that defines the forced convection chamber FC including the internal forced convection space FS thereof. Referring also to FIGS. 2 and 2A, the housing portion H1 includes a heat sink access opening or an open heat sink access window HW located between and providing access between the internal space PS of the passive chamber PC and the internal space FS of the forced convection chamber FC. The housing portion H1 defines a perimeter PR of the heat sink access opening HW that extends peripherally around the heat access opening. The heat sink HS is operatively installed in the access opening HW such that the heat output portion HO (cooling fins CF of the cooling fin structure CFS) extend through the heat sink access opening HW so as to be located in the internal space FS of the forced convection chamber FC, and such that the base HB of the heat sink is located in and blocks the heat sink access opening HW. The outer wall HBW or other part of the heat sink base HB is at least partially located in the internal space PS of the passive chamber PC or the outer wall HBW or other part of the heat sink base HB is at least exposed to the internal space PS of the passive chamber PC so that the outer wall HBW or other part of the base HB is accessible for thermal engagement with the processor MP or other electronic component EC of the main printed circuit board assembly P1. The heat sink base HB comprises a flange HF that projects outwardly from the base HB and abuts the forced convection housing portion H1 in the region of the perimeter PR of the heat sink access opening HW when the heat sink HS is operatively installed in the heat sink access opening HW. A foam, elastomeric, or other gasket or seal HG extends continuously around the heat sink access opening HW and/or flange HF between the housing portion H1 and the flange HF and sealingly engages the heat sink flange HF to the housing portion H1 at the perimeter of the access opening HW to prevent the fan-forced airflow FX in the internal forced convection space FS from flowing through the access opening HW into the internal space PS of the passive chamber NC as would undesirably expose the printed circuit board P1 to forced convection airflow FX. The structure of the present development thus ensures that the portion of the heat sink base HB located in and/or exposed to the passive space PS is separated or isolated in terms of airflow from the cooling fins CF or other heat output portion HO of the heat sink HS that is located in the forced convection space FS by the flange HF or other portion of the heat sink HS that blocks and seals the access opening HW. To facilitate an airtight seal between the flange HF and the perimeter PR of the access opening HW, the flange HF or other part of the heat sink base HB includes a plurality of base mounting structures or mounting locations BT that include an aperture or that are otherwise adapted to receive a screw or other fastener FB (one shown in FIG. 6) that is threaded into or otherwise engaged with the forced convection housing H1 in the region of the access opening perimeter PR.

As noted above, at least some of the electronic components of the printed circuit board assembly P1 are abutted and thermally engaged with the base HB of the heat sink such that heat is conducted into the base HB, and from the base HB into the cooling fin structure CFS or other heat output portion HO. The forced airflow FX induced by the fans F1,F2 and moving through the interior space FS of the forced convection chamber FC and over the cooling fins CF provides highly efficient cooling while being isolated from the printed circuit board P1 which is located entirely in the interior space PS of the passive chamber PC. As such, the printed circuit board P1 is isolated from and protected from the forced airflow FX.

Figure 5:
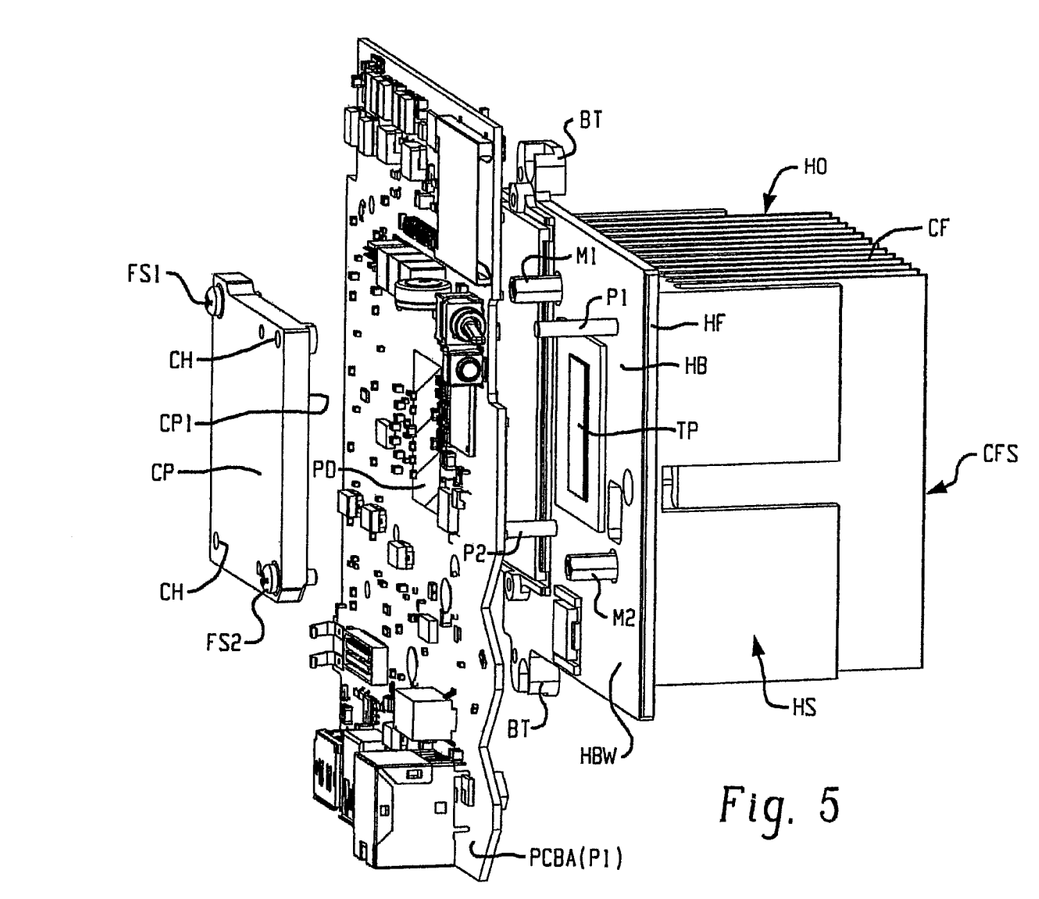
FIGS. 5 and 6 are respective exploded isometric view that shows the heat sink of FIG. 3, a main circuit board PCBA, and a clamping plate CP used to secure the main circuit board PCBA operatively to the heat sink.
Figure 6:
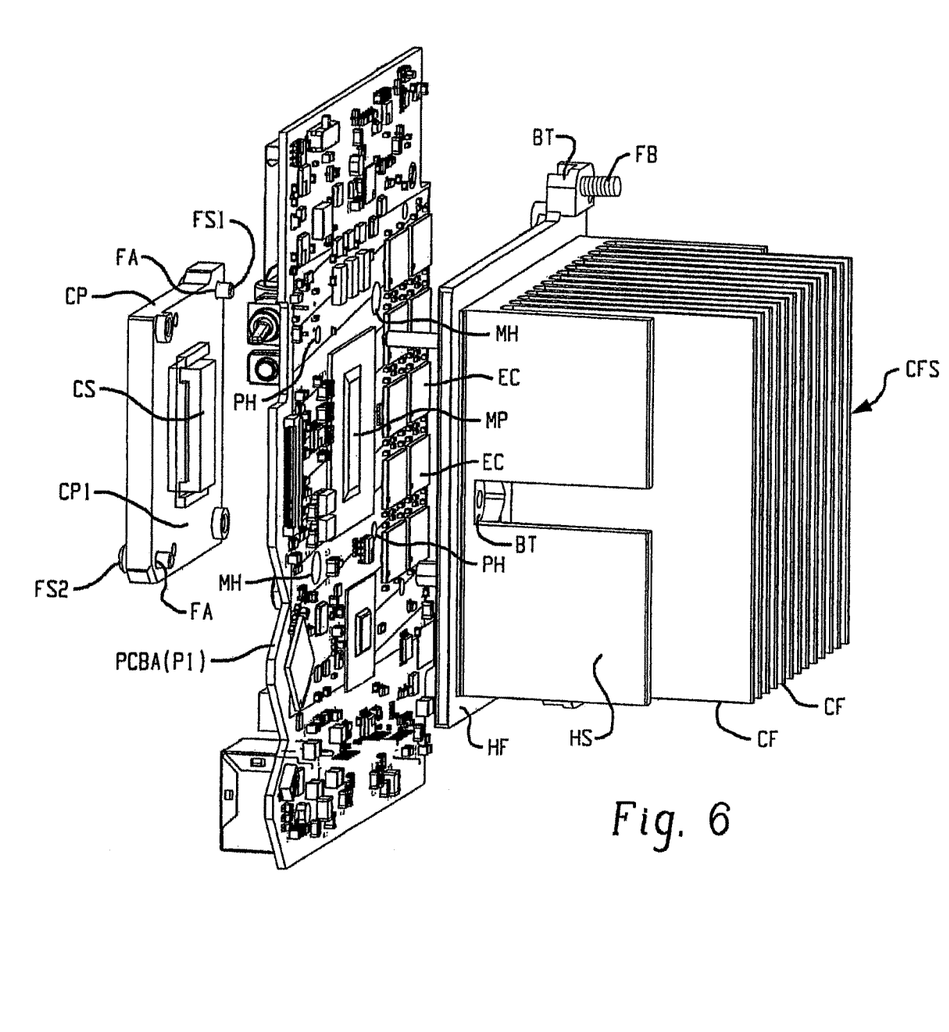

FIGS. 5 and 6 are exploded views that shows the heat sink HS and main printed circuit board assembly P1 and a clamping plate CP used to operatively and fixedly secure the printed circuit board assembly P1 to the heat sink HS for effective thermal coupling of the processor MP of the printed circuit board assembly P1 to the heat sink base HB. The controller housing H and other structures are not shown in FIGS. 5-8B.

In the illustrated embodiment, the heat sink HS includes first and second (at least two) standoff mounts M1,M2, and first and second (at least two) alignment pins P1,P2, all projecting outwardly from the outer wall HBW of the base HB in a direction opposite or away from the heat output portion HO (cooling fin structure CFS). The standoff mounts M1,M2 and alignment pins P1,P2 are together arranged in a rectangular pattern, with the standoff mounts M1,M2 being diagonally located relative to each other and with the alignment pins P1,P2 being diagonally located relative to each other to provide optimum clamping force distribution as described below.

Figure 7:
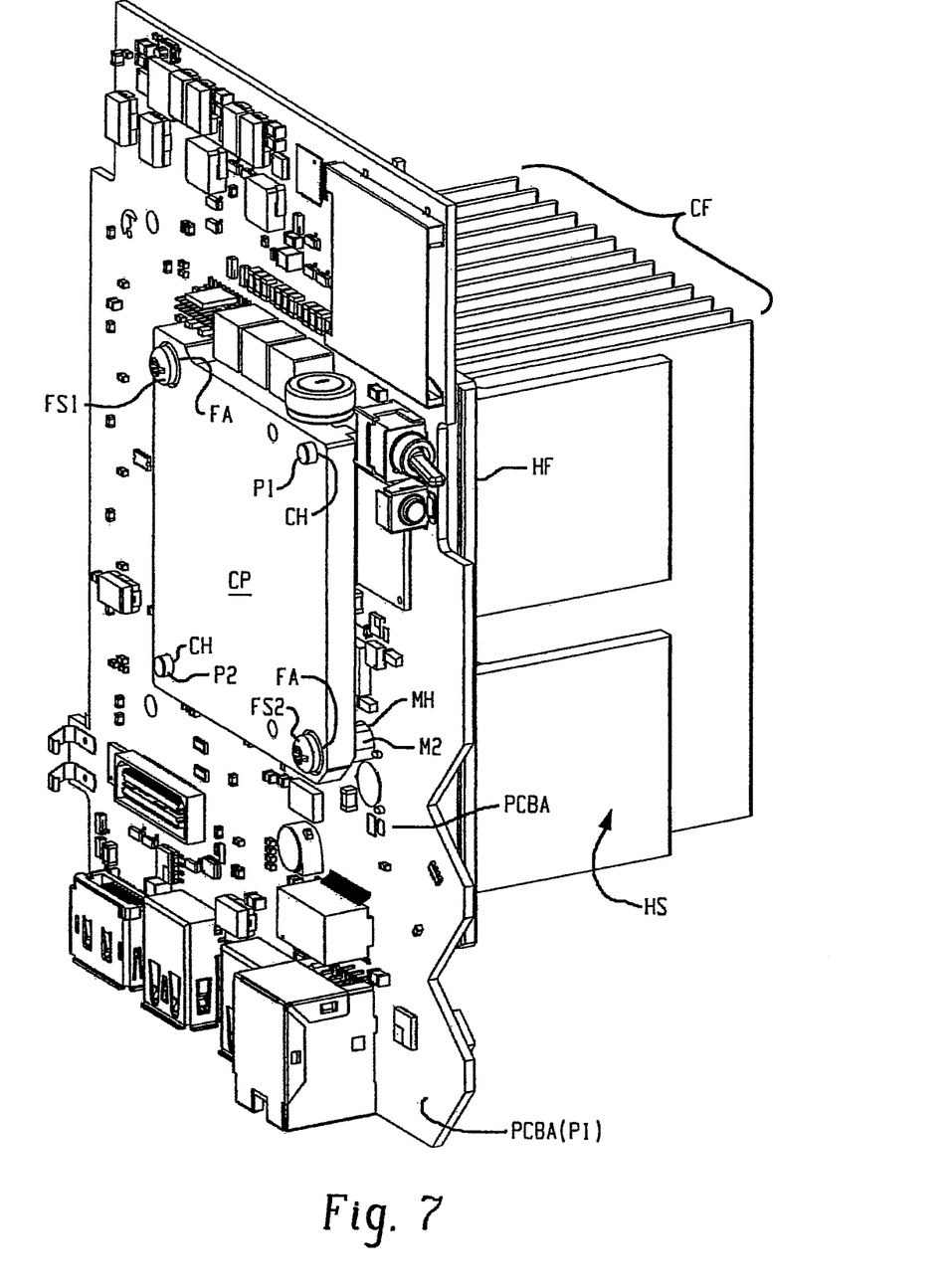
FIG. 7 is an assembled isometric view that shows the main circuit board PCBA (P1) assembled to the heat sink using the clamping plate to provide a heat sink subassembly.
Figure 8A:
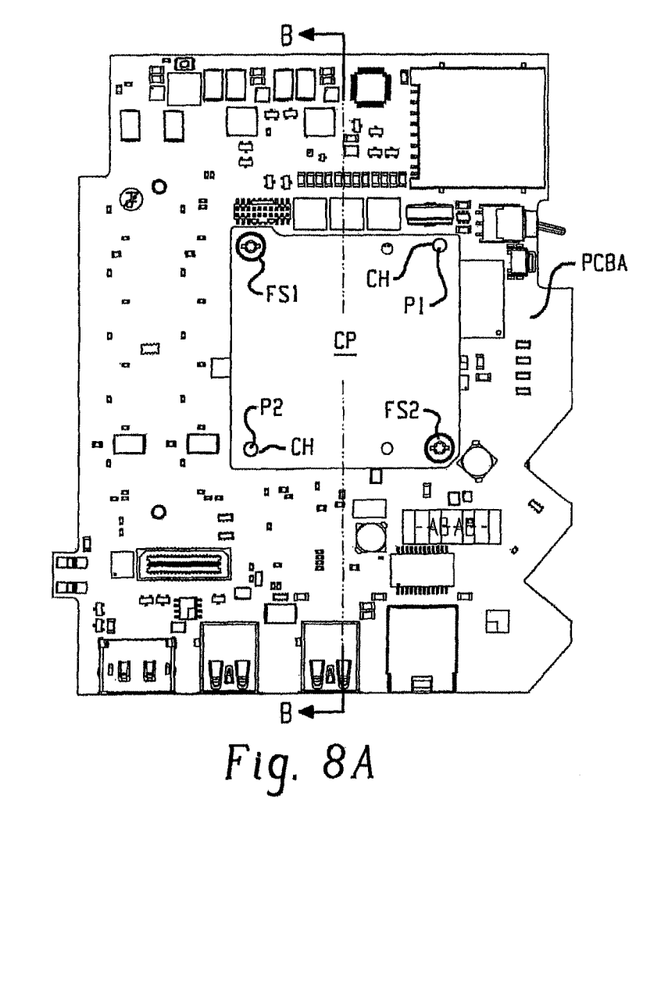
FIG. 8A is a side view of the heat sink subassembly of FIG. 7.
Figure 8B:
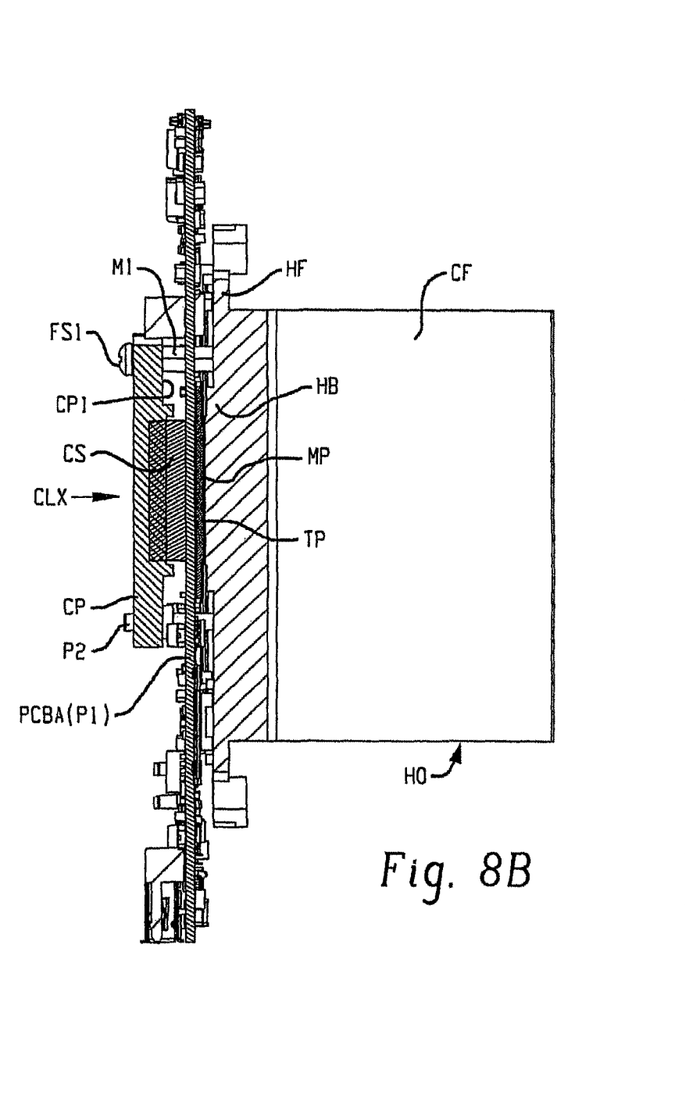
FIG. 8B is a section view taken at B-B of FIG. 8A.

FIG. 7 is an isometric view that shows the printed circuit board assembly P1 operably connected or assembled to the base HB of the heat sink HS using the clamping plate CP. The clamping plate CP is provided by an aluminum or other metallic or polymeric or other rigid plate structure. FIG. 8A is a side view that shows the PCBA assembled to the heat sink HS using the clamping plate CP. FIG. 8B is a section view taken at B-B of FIG. 8A.

The standoff mounts M1,M2 extend through standoff apertures or standoff holes MH of the printed circuit board assembly P1. The standoff mounts M1,M2 are preferably internally or otherwise threaded. Likewise, the alignment pins P1,P2 extend through alignment apertures or alignment holes PH in the printed circuit board assembly P1 to ensure that the printed circuit board assembly P1 is properly aligned and position with respect to the with the heat sink base HB. A resilient thermal interface pad TP (FIG. 3) is adhesively or otherwise secured to the heat sink base HB and/or to the processor MP, and engagement of the alignment pins P1,P2 with the respective alignment holes PH of the printed circuit board assembly P1 ensures that the thermal interface pad TP is properly operatively located between the processor MP and heat sink base HB as required for the processor MP to be thermally coupled to the thermal interface pad TP and to the heat sink base HB through the thermal interface pad TP. In one embodiment the thermal interface pad comprises a silicone based or other polymeric or elastomeric substrate including ceramic particles or other thermally conductive material therein. The thermal interface pad TP need not be preformed and can alternatively be formed in place by application of a layer of the thermally conductive material between the heat sink base HB and the processor MP or other electronic component EC thermally coupled to the heat sink base HB.

To ensure proper location of the clamping plate CP, the alignment pins P1,P2 also extend through apertures or holes CH defined in the clamping plate CP (see FIGS. 5, 7, 8A). Clamping plate fastening screws or other clamping plate fasteners FS1,FS2 are used to secure the clamping plate CP to the standoff mounts M1,M2 to connect the clamping plate CP to the standoff mounts M1,M2 of the heat sink HS. The clamping plate fastening screws/fasteners FS1,FS2 can be captured to the clamping plate or are separate components that are inserted through corresponding fastener apertures FA defined in the clamping plate CP. In the illustrated embodiment, the clamping plate fasteners FS1,FS2 are threadably engaged with the internal or other threads of the respective standoff mounts M1,M2. The printed circuit board assembly P1 is thus captured to the heat sink HS adjacent the base HB. In particular, the printed circuit board assembly P1 is captured between the heat sink base HB on one side and the clamping plate CP on the opposite side. The standoff mounts M1,M2 engage the inner face CP1 of the clamping plate to maintain a select standoff distance between the inner face CP1 of the clamping plate CP and the heat sink base HB to prevent over-tightening or over-advancement of the clamping plate CP relative to the heat sink base HB as would increase the clamping force CLX above a desired limit that could cause damage to the processor MP and/or other parts of the printed circuit board assembly P1.

As shown in FIGS. 6 and 8B, the clamping plate CP includes an inner face CP1 that is oriented toward the printed circuit board assembly P1 and that includes a resilient, compliant spring member or spring CS such as an elastomeric spring or another suitable resilient member that applies a clamping force CLX directly to the die PD (FIG. 5) of the processor MP on the side of the printed circuit board assembly P1 oriented away from the heat sink base HB when the clamping plate CP is operatively secured to the heat sink HS. The spring CS applies the clamping force CLX to the die PD of the processor MP with a known spring rate such that the spring CS compensates for tolerance stack conditions to ensure that excessive clamping force is not exerted on the processor MP by the clamping plate CP as could cause damage to the processor MP or other part of the printed circuit board assembly P1. When the clamping plate CP is operatively installed and secured to the heat sink base HB using the clamping plate fasteners FS1,FS2, the clamping plate CP and spring CS urge the processor MP into engagement with the heat sink base HB through the thermal pad TP to provide a highly effective and efficient thermal coupling between the processor MP and the heat sink base HB by way of the thermal pad TP. It should be noted that the clamping plate CP applies clamping force CLX only through the spring CS and the die of the microprocessor MP, which ensures that the printed circuit board assembly P1, itself, is not compressed, bent or flexed as could induce undesired and potentially damaging bending stresses in the printed circuit board assembly P1 and the processor MP.

The present development thus results in the ball grid array (BGA) solder joints of the processor MP being loaded substantially in compression instead of the transverse shear they would otherwise experience if a force were applied to the printed circuit board in a location that would cause bending stress. The present development thus provides a means of creating and maintaining a pre-determined force CLX between a processor die PD and a heat sink HS directly across a printed circuit board assembly P1 and the processor MP instead of inducing bending stress in the printed circuit board assembly P1 and solder joints of the processor MP. This is advantageous because the strength of BGA solder joints on a microprocessor package is higher in compression than in transverse shear.

External stress from operating in an industrial environment (e.g. mechanical shock, vibration) typically results in additional bending (i.e. transverse shear stress) of the printed circuit board assembly P1. Extra operating stress margin is provided by the present development by reducing or eliminating what would otherwise be a "pre-load" of transverse shear created by more typically used heat sink mounting methods and structures.

The clamping force CLX is applied by a compliant member CS with a known spring rate. The spring rate is chosen such that the clamping force CFX applied is within the processor manufacturer's recommendation across the range of deflection resulting from component tolerances (e.g. printed circuit board thickness, component heights, final soldered joint height). The present development provides a means of creating and maintaining a pre-determined force between a processor die PD and a heat sink HS directly across a printed circuit board assembly P1 and the processor MP instead of inducing bending stress in the printed circuit board assembly P1 and processor MP.

The present method for operatively securing a heat sink HS in intimate contact with a processor or other electronic component for optimum thermal transfer facilitates use of a very thin thermal interface TP material between the processor MP and the heat sink HS because the assembly is relatively insensitive to the tolerance stackup of system components. This allows higher heat dissipation to the heat sink HS and external environment and therefore processor performance than otherwise available in a correspondingly sized product operating in high ambient temperature conditions. In certain embodiments, this present development also allows for greater component and trace density on the printed circuit board assembly P1 because somewhat less space or "real estate" on the printed circuit board assembly P1 is reserved for heat sink attachment hardware which would otherwise be required. In other words the present clamping system minimizes the space on the printed circuit board assembly P1 required for engaging and retaining the heat sink HS in thermal contact with the processor MP.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An electronics module comprising:
 a housing comprising: (i) a forced convection chamber including an internal forced convection space; and, (ii) a passive chamber including an internal passive space that is separated from the forced convection space of the forced convection chamber;
 said housing further comprising a heat sink access opening that provides access between the forced convection space and the passive space;
 at least one fan connected to the housing and adapted to induce forced convection airflow in the forced convection space;
 a heat sink connected to the housing, said heat sink comprising: (i) a heat input portion comprising a base located in the passive space of the passive chamber; and, (ii) a heat output portion comprising a plurality of cooling fins located in the forced convection space of the forced convection chamber;
 said heat sink installed in said heat sink access opening and blocking airflow between the forced convection space and the passive space through said access opening;
 a circuit board assembly located in the passive space and secured to the base of the heat sink, said circuit board assembly comprising a microprocessor die that is thermally engaged with the base the heat sink;
 a resilient thermally conductive material located between an outer wall of the heat sink base and said microprocessor die;
 a clamping plate secured to the heat sink base, wherein said circuit board assembly is captured between the clamping plate and the outer wall of the heat sink base to secure the circuit board assembly to the heat sink base in the passive space, said heat sink base comprising first and second standoff mounts that project outwardly from the heat sink base and that extend through the circuit board assembly, said clamping plate secured to the first and second standoff mounts to maintain a select standoff distance between the clamping plate and the heat sink base;
 a resilient spring located between the clamping plate and the microprocessor die of the circuit board assembly;
 wherein said clamping plate exerts a clamping force through said resilient spring on said microprocessor die that maintains said microprocessor die in contact with said thermally conductive resilient material located on the heat sink base, said clamping force exerted only on said microprocessor die.

2. The electronics module as set forth in claim 1, wherein said housing defines a perimeter of the heat sink access opening, and wherein the heat sink comprises a flange that is abutted with the perimeter of the heat sink access opening.

3. The electronics module as set forth in claim 2, further comprising a gasket located between the flange and the perimeter of the heat sink access opening.

4. The electronics module as set forth in claim 1, wherein the housing includes a plurality of slots defined therein that provide communication between an ambient atmosphere surrounding the housing and the passive space of the passive chamber such that said passive chamber allows natural convection airflow through the passive space thereof.

5. The electronics module as set forth in claim 1, wherein said spring comprises an elastomeric spring.

6. A heat sink subassembly comprising:
 a heat sink including a base and a heat output region connected to the base;
 at least two standoff mounts that project outwardly from the base of the heat sink and that are diagonally located relative to each other;

at least two alignment pins that project outwardly from the base;

a clamping plate secured to the heat sink base;

a circuit board comprising a microprocessor die captured adjacent the heat sink base by said clamping plate;

a resilient spring located between the clamping plate and the microprocessor die of the circuit board;

a thermally conductive resilient material located on the heat sink base between the microprocessor die and the heat sink base;

wherein standoff mounts extend through the circuit board and the clamping plate is secured to the standoff mounts such that a standoff distance is maintained between the clamping plate and the heat sink base;

wherein said alignment pins each extend through respective openings defined in the circuit board and the clamping plate to maintain alignment of the circuit board and the clamping plate relative to the heat sink base;

wherein said clamping plate exerts a clamping force on said microprocessor die that maintains said microprocessor in contact with said thermally conductive resilient material located on the heat sink base; and, said clamping force is exerted only on said microprocessor die only through said resilient spring located between said clamping plate and said microprocessor die.

7. The subassembly as set forth in claim 6, wherein said at least two standoff mounts are each internally threaded and wherein said heat sink subassembly further comprises fasteners that extend through the clamping plate and that are respectively threadably engaged with the at least two standoff mounts to secure the clamping plate to the standoff mounts.

8. The subassembly as set forth in claim 6, wherein the resilient spring located between the clamping plate and the circuit board comprises a resilient elastomeric spring.

\* \* \* \* \*